(12) United States Patent
Drako

(10) Patent No.: US 9,671,439 B2
(45) Date of Patent: Jun. 6, 2017

(54) CIRCUIT BREAKER WITH INTEGRATED POWER MEASUREMENT

(71) Applicant: Dean Drako, Austin, TX (US)

(72) Inventor: Dean Drako, Austin, TX (US)

( * ) Notice: Subject to any disclaimer, the term of this patent is extended or adjusted under 35 U.S.C. 154(b) by 59 days.

(21) Appl. No.: 14/532,178

(22) Filed: Nov. 4, 2014

(65) Prior Publication Data

US 2016/0103161 A1 Apr. 14, 2016

Related U.S. Application Data

(60) Provisional application No. 62/062,961, filed on Oct. 13, 2014.

(51) Int. Cl.
| | |
|---|---|
| *G01R 21/00* | (2006.01) |
| *H02H 3/08* | (2006.01) |
| *H02H 3/16* | (2006.01) |
| *H02H 5/04* | (2006.01) |
| *G01R 15/20* | (2006.01) |
| *G01R 31/327* | (2006.01) |
| *G01R 1/20* | (2006.01) |
| *G01R 19/10* | (2006.01) |

(52) U.S. Cl.
CPC .............. *G01R 21/00* (2013.01); *H02H 3/08* (2013.01); *H02H 3/162* (2013.01); *H02H 5/047* (2013.01); *G01R 1/203* (2013.01); *G01R 15/202* (2013.01); *G01R 19/10* (2013.01); *G01R 31/3277* (2013.01)

(58) Field of Classification Search
CPC .... G01R 21/00; G01R 19/2513; G01R 21/06; G01R 22/00; G01R 31/327; H01H 2071/006; H02H 3/20; G05F 1/66; Y04S 20/14

USPC .......................................................... 324/242
See application file for complete search history.

(56) References Cited

U.S. PATENT DOCUMENTS

| | | | | |
|---|---|---|---|---|
| 5,391,983 A | * | 2/1995 | Lusignan | G01R 21/133 324/142 |
| 6,292,717 B1 | * | 9/2001 | Alexander | G01R 19/2513 340/6.1 |
| 2009/0206059 A1 | * | 8/2009 | Kiko | H02J 3/14 218/143 |
| 2009/0265041 A1 | * | 10/2009 | Benjamin | G05B 9/02 700/292 |
| 2010/0036624 A1 | * | 2/2010 | Martin | G01R 22/10 702/61 |
| 2013/0211751 A1 | * | 8/2013 | Park | G01R 21/06 702/61 |
| 2014/0354439 A1 | * | 12/2014 | Nguyen | G08B 21/182 340/660 |

(Continued)

*Primary Examiner* — Son Le
*Assistant Examiner* — Akm Zakaria
(74) *Attorney, Agent, or Firm* — Patentry

(57) ABSTRACT

A circuit apparatus measures, records, transmits, and displays actual and estimated power consumption in a branch circuit of an electrical distribution system. The apparatus includes a display driver coupled to one or more current sensors which derives or estimates power consumption from measured current. The accuracy of power consumption is improved by additional measurement of actual supplied voltage. A plurality of current sensors determine differential current to provide ground fault interruption to a desired range of precision. A store enables display of surge and average current measurements and power measurements in addition to immediate results.

3 Claims, 7 Drawing Sheets

(56) References Cited

U.S. PATENT DOCUMENTS

2015/0006095 A1\* 1/2015 Voisine ................ G01R 27/14
702/65

\* cited by examiner

CIRCUIT BREAKER WITH INTEGRATED POWER MEASUREMENT

CROSS-REFERENCES TO RELATED APPLICATIONS

This application benefits from its related provisional application 62062961 filing date 13 Oct. 2014.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISK OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

Technical Field

Class 200 electricity: circuit makers and circuit breakers with power measurement.

Description of the Related Art

Power consumption has become a concern for both industry and homeowners. Everyone wants to save money but it is difficult to identify where energy is being consumed in a specific building or within a structure and see the effect of making changes.

Conventional circuit breakers protect wiring from over current by triggering on heat or magnetic field intensity.

As is known, Deutsches Reichspatent DRP 458392, electrical conductors in buildings are protected from overcurrent by circuit breakers or circuit interrupters installed at the electrical panel where electrical service feed is distributed to branch circuits.

Conventional ground fault interrupters protect consumers from electrocution by triggering on a differential between hot and neutral currents.

What is needed is a way to observe immediate feedback on energy consumption/conservation policies and activities across many branch circuits simultaneously and surge consumption.

BRIEF SUMMARY OF THE INVENTION

A replacement circuit interrupter measures and displays amperage and power delivered to its branch circuit. Averaged or surged quantities may be stored and displayed. One or a plurality of current or voltage sensors provide measured values for display or transformation.

A circuit apparatus couples elements which measure, record, transmit, and display actual and estimated power consumption in a branch circuit of an electrical distribution system. The elements include a display driver and one or more current sensors which estimate or derive power consumption from measured current. The accuracy of power consumption is improved by an additional measurement element of actual supplied voltage. Differential current is determined by a plurality of current sensors to provide ground fault interruption within a desired range of precision. A store enables display of surge and average current measurements and power measurements in addition to immediate results.

Voltage measurements are transformed into power values.

BRIEF DESCRIPTION OF THE SEVERAL VIEWS OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DISCLOSURE OF EMBODIMENTS OF THE INVENTION

Conventional circuit protectors are concerned with preventing current or voltage outside of a threshold or beyond an extent of time. But energy consumption or conservation objectives are not served by these essentially binary triggers.

Applicant discloses a solution which can be embodied as a little IC chip in the circuit breaker.

The important part is to have the VOLTMETER that will tell us amperage.

In one embodiment, Amperage is measured by measuring VOLTAGE drop across a very Low Value resistor. This very low value resistor can be a component in the circuit breaker or can use the bimetal portion of the circuit breaker as a resistor.

As is known, because CURRENT (AMPS)=VOLTAGE/RESISTANCE we can determine the amount of current by a measurement of potential or voltage.

Once we know the current (in our little micro controller) that drives the display, in an embodiment, a little LCD display.

The display is calibrated to transform the measured voltage to display AMPS in the basic version.

In one embodiment, the display further transforms to Multiply by a fixed number (like 120V) to get power in a normal circuit. Breakers usually are designed only for a single voltage so we can mix by a fixed number to get POWER (WATTS).

A switch, not shown, can either display AMPS or POWER.

In an enhanced version, the apparatus has a VOLT METER, which would require an additional connection with the breaker to get the other side of the circuit. In this version, the apparatus multiplies the ACTUAL voltage by the ACTUAL CURRENT to get the POWER. This is not really necessary and makes us less backwards compatible but may be advantageous in the future when electric utilities shape their power waveforms.

Figure 4:
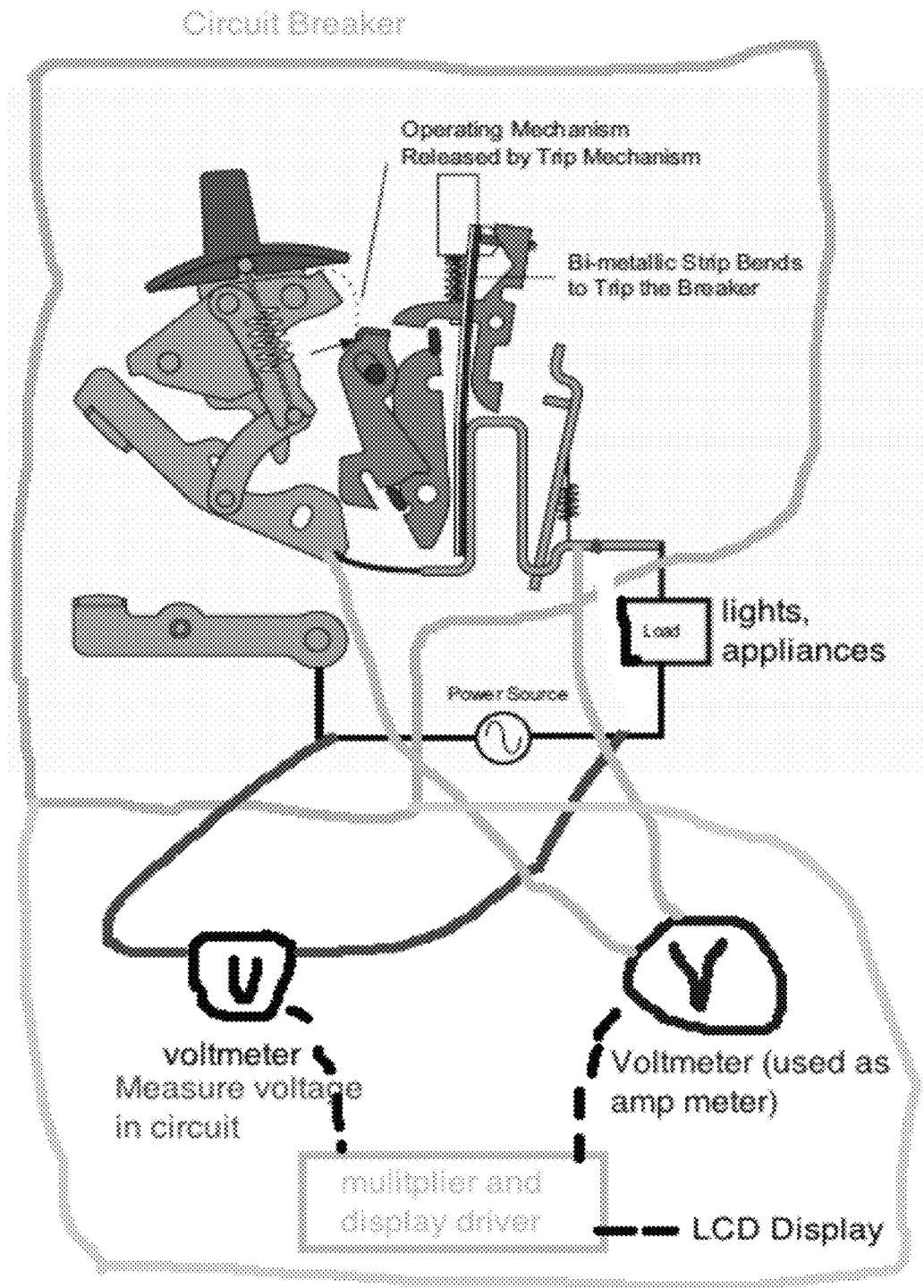
FIG. 4 illustrates an embodiment which measures voltage and current for a thermal overcurrent breaker.

A colorized illustration FIG. 4 shows a blue boundary surrounding one exemplary intended improved circuit breaker in a bimetal embodiment.

Other overcurrent interrupters such as magnetic and hybrid bimetal-magnetic are similarly improved by applicant's invention. By actually measuring current, Applicant can more accurately protect from overcurrent and overpower conditions. By actually measuring both forward and return current, Applicant can more accurately protect from differential or ground fault current.

Basically, we are putting a really small AMP METER inside the breaker and connecting it to a display which may be positioned on the exterior face of the breaker or may be remotely connected.

Figure 2:
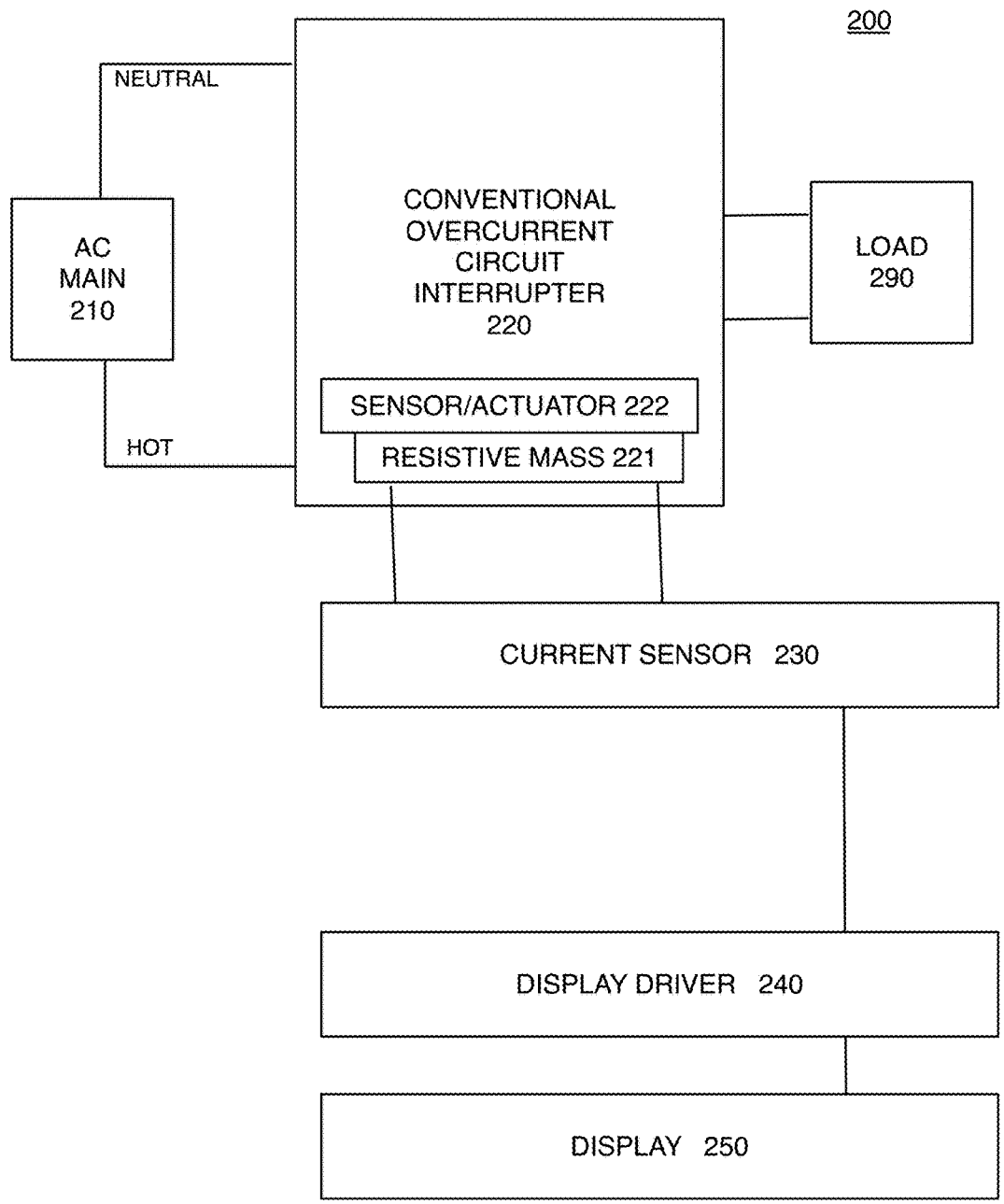
FIG. 2 discloses a basic embodiment of the claimed subject matter which is immune to temperature or magnetic field.

Referring now to the Figures, a power consumption monitoring apparatus compatible with replaceable panel circuit breakers is disclosed in FIG. 2 as follows: a display 250; the display coupled to, a display driver 240; the display driver coupled to, a current sensor 230, the current sensor coupled to a conventional overcurrent circuit interrupter 220, the conventional overcurrent circuit interruptor having, a sensor/actuator mechanism 222; coupled to, a resistive mass 221 through which current flows in normal operation and provides a measurable voltage drop to the current sensor.

In an embodiment, the sensor/actuator is a bimetal thermal sensor/actuator.

In an embodiment, the sensor/actuator is a magnetic sensor/actuator.

In an embodiment, the sensor/actuator is a hybrid thermal/magnetic sensor/actuator.

In an embodiment, the current sensor is calibrated to determine a current value from a voltage across the resistive mass and the display driver is configured to provide a power value from the current value by using a standard source voltage quantity.

Figure 3:
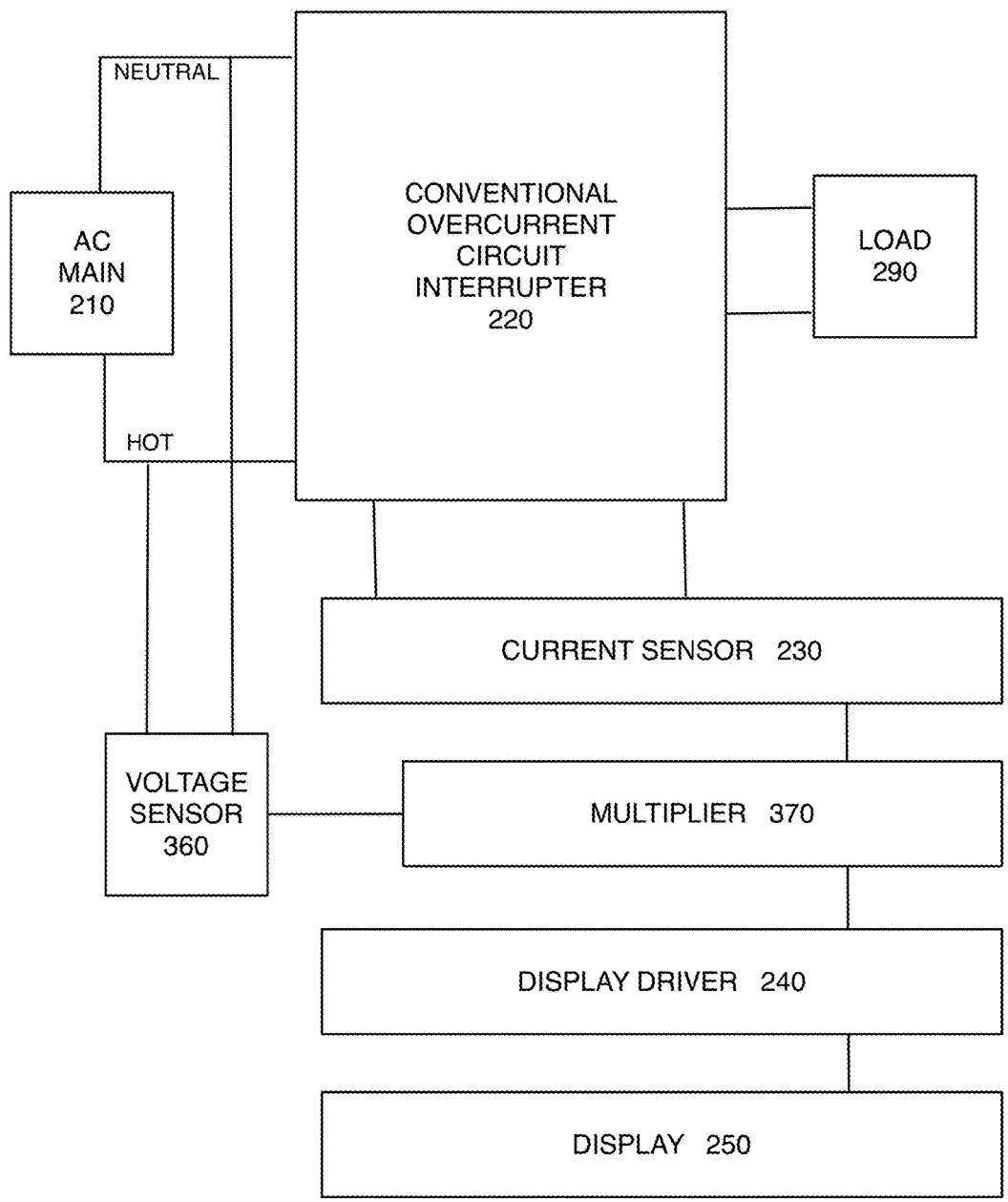
FIG. 3 illustrates an embodiment which determines actual power from measured voltage and current.

In an embodiment, the apparatus as illustrated in FIG. 3 also has a voltage sensor 360 coupled to the neutral and hot inputs to the circuit interrupter and a multiplier 370 coupled to the current sensor 230 and to the voltage sensor 360 whereby an actual measured voltage and current are transformed to a power value and provided to the display driver 240. As is known, current sensors transform a potential across a known conductor or semiconductor into a measure of amperage.

In an embodiment illustrated in FIG. 4, the current sensor 230 is a first voltmeter spanning the thermal sensor/actuator and the voltage sensor 360 is a second voltmeter spanning the power source supply.

Figure 5:
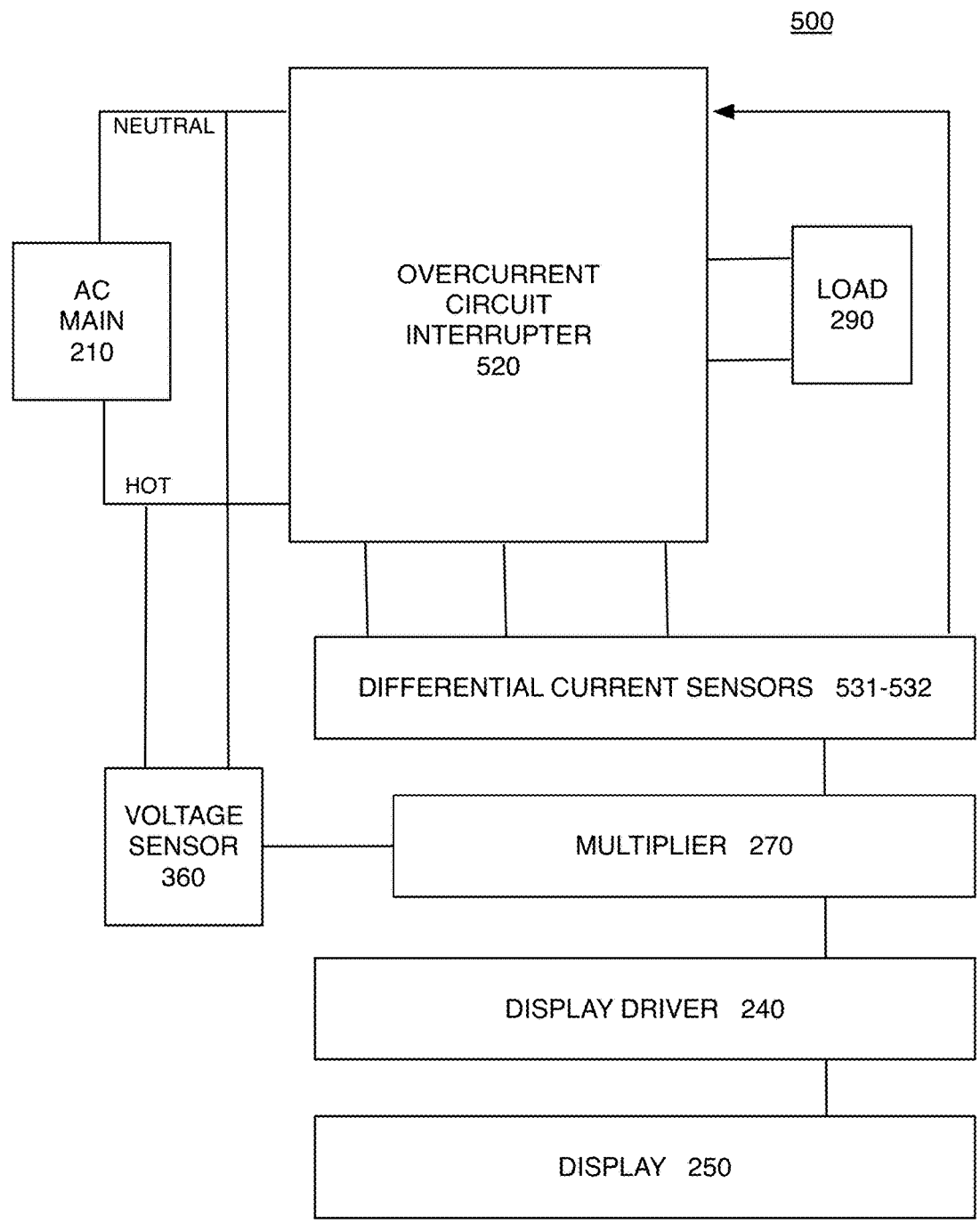
FIG. 5 illustrates an embodiment which enables ground fault interruption.
Figure 6:
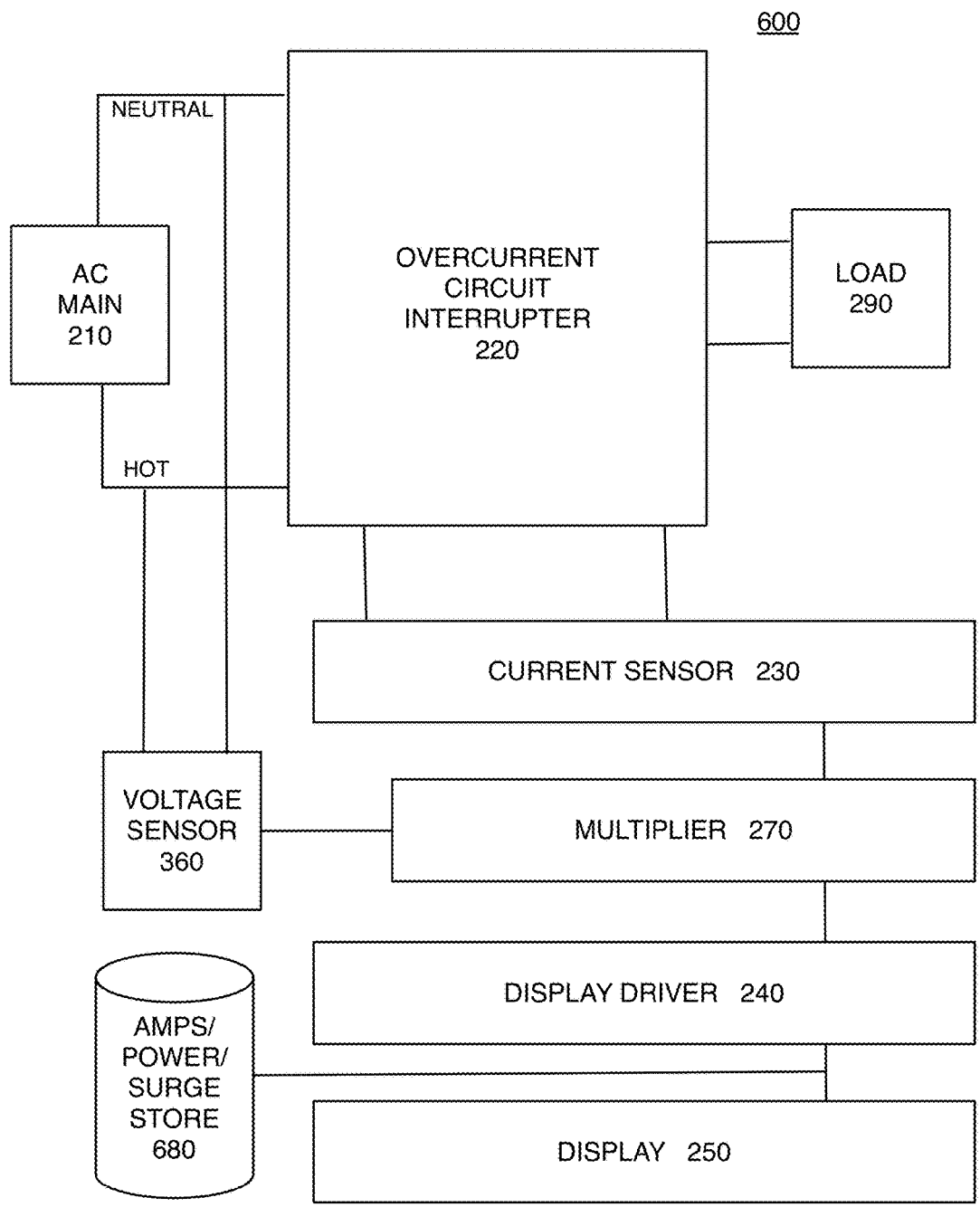
FIG. 6 illustrates an embodiment of the invention which provides history.

In an embodiment illustrated in FIG. 5, the current sensor comprises differential current sensors 531 532 to measure current out to and current back from a load, and a subtraction circuit with programmable masking to determine leakage above a threshold (residual current) coupled to the circuit interrupter to provide ground fault interruption.

In an embodiment, the differential current sensors are Hall transducers or may be one Hall transducer which is multiplexed between forward and return conductors.

In an embodiment, the apparatus also has a store 680 coupled to the display driver 240 and coupled to the display 250 whereby surge amps and surge power can be retrieved for display and averaged amps and averaged power can be accumulated for display.

In an embodiment, the display driver 240 further includes a codec for transmission of current and power to a remote display either wired or wireless.

Figure 7:
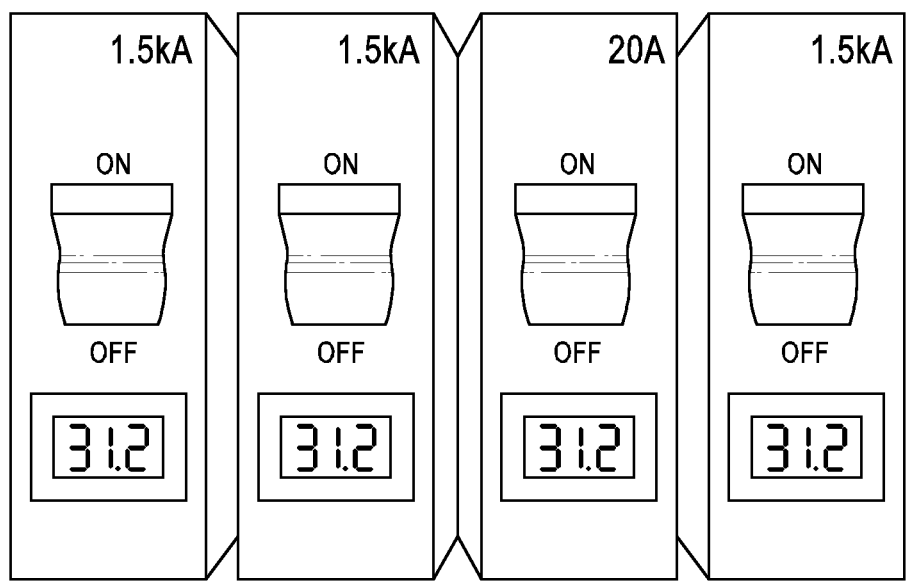
FIG. 7 is a visualization of a example of productization.

FIG. 7 is a illustrative graphical representation of a product enabled by the present invention.

CONCLUSION

The present subject matter may be easily distinguished from conventional circuit interrupters by continuous measurement of actual amperes and or voltage instead of detection of a magnetic field or temperature which exceeds a threshold. The present subject matter may be easily distinguished from circuit interrupters which only detect an imbalance or differential current without regard to the current delivered to the load. The presently disclosed subject matter may be easily distinguished by its display of instantaneous current or power and stored average or surge current or power and the display and/or store elements of the apparatus.

The techniques described herein can be implemented in digital electronic circuitry, or in computer hardware, firmware, software, or in combinations of them. The techniques can be implemented as a computer program product, i.e., a computer program tangibly embodied in a machine-readable storage device, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps of the techniques described herein can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

Figure 1:
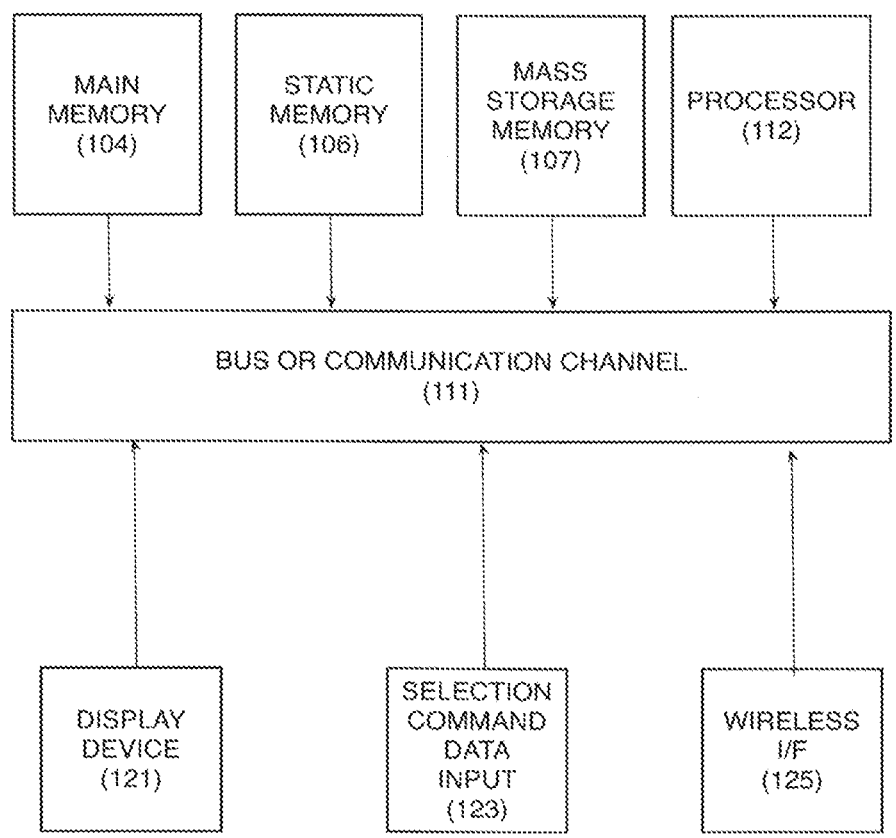
FIG. 1 is a block diagram of a conventional processor used for performing method steps in an apparatus.

FIG. 1 illustrates an exemplary programmable processor comprising a bus or communication channel 111 coupling main memory 104, static memory 106, mass storage memory 107, and a processor circuit 112 for executing instructions, and in embodiments at least one interface to couple a display device 121, a selection command data input 123, and/or a wireless interface 125.

A number of embodiments of the invention have been described. Nevertheless, it will be understood that various modifications may be made without departing from the spirit and scope of the invention. For example, other network topologies may be used. Accordingly, other embodiments are within the scope of the following claims.

SEQUENCE LISTING

Not Applicable

The invention claimed is:

1. A power consumption monitoring apparatus compatible with replaceable panel circuit breakers, the apparatus comprising:
   a display; the display coupled to,
   a display driver; the display driver coupled to,
   a current sensor, the current sensor coupled to,
   an overcurrent circuit interrupter, the conventional overcurrent circuit interruptor having, a sensor/actuator mechanism; the sensor/actuator coupled to,
   a resistive mass through which current flows in normal operation and provides a measurable voltage drop to the current sensor; wherein the current sensor is calibrated to determine a current value from a voltage across the resistive mass, and the display driver is configured to a provide a power value from the current value by using a standard source voltage quantity;
   a voltage sensor coupled to the neutral and hot inputs to the overcurrent circuit interrupter and a multiplier coupled to the current sensor and to the voltage sensor whereby an actual measured voltage and current are transformed to a power value and provided to the display driver;
   wherein the current sensor comprises:
      differential current sensors to measure current out to and current back from a load, and
      a subtraction circuit with programmable masking to determine leakage above a threshold coupled to the overcurrent circuit interrupter to provide ground fault interruption.

2. The apparatus of claim 1 wherein the differential current sensors to measure current out to and current back from a load are Hall transducers.

3. The apparatus of claim 2 further comprising:
   a storage element coupled to the display driver and coupled to the display whereby surge amps and surge power can be retrieved for display and averaged amps and averaged power can be accumulated for display.

* * * * *